(12) United States Patent
Yang et al.

(10) Patent No.: US 11,920,467 B2
(45) Date of Patent: Mar. 5, 2024

(54) MINIMIZATION OF DRILL STRING ROTATION RATE EFFECT ON ACOUSTIC SIGNAL OF DRILL SOUND

(71) Applicant: Saudi Arabian Oil Company, Dhahran (SA)

(72) Inventors: Yunlai Yang, Dhahran (SA); Wei Li, Beijing (CN)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 17/575,214

(22) Filed: Jan. 13, 2022

(65) Prior Publication Data

US 2023/0220769 A1    Jul. 13, 2023

(51) Int. Cl.
*E21B 49/00* (2006.01)
*G01R 23/17* (2006.01)
(Continued)

(52) U.S. Cl.
CPC ............ *E21B 49/003* (2013.01); *G01R 23/17* (2013.01); *G01V 1/46* (2013.01); *G01V 1/50* (2013.01);
(Continued)

(58) Field of Classification Search
CPC ........ E21B 49/003; G01R 23/17; G01V 1/46; G01V 1/50; G01V 2200/16; G01V 2210/1216
See application file for complete search history.

(56) References Cited

U.S. PATENT DOCUMENTS 4,173,898 A    11/1979    Forstermann et al.
4,380,930 A     4/1983    Podhrasky et al.
(Continued)

FOREIGN PATENT DOCUMENTS

CA    2305161 A1 *  4/1999
EP    0117280        4/1990
(Continued)

OTHER PUBLICATIONS

Y. Yang and et al, "A Tool for Derivation of Real Time Lithological Information from Drill Bit Sound", SPE-204895-MS, Society of Petroleum Engineers, published online on Dec. 15, 2021 (Year: 2021).*

(Continued)

*Primary Examiner* — Douglas Kay
(74) *Attorney, Agent, or Firm* — Fish & Richardson P.C.

(57) ABSTRACT

Systems and methods include a computer-implemented method for determining normalized apparent power. Drilling acoustic signals corresponding to a time domain and generated during drilling of a well. A fast Fourier transformation (FFT) is performed using the drilling acoustic signals to generate FFT data. Normalized FFT data is generated using normalization parameters and a drill string rotation rate record of a drill string used to drill the well. The drill string rotation rate is received during drilling. Normalized apparent power is determined from data points of a predetermined top percentage of the normalized FFT data within a lithological significant frequency range. The normalized apparent power is a measure of the power of the drilling acoustic signals and it is a function of the amplitude and frequency of the normalized FFT data. The lithological significant frequency range is a frequency range within which the drill sounds are more closely related with lithology.

18 Claims, 9 Drawing Sheets

(51) Int. Cl.
  *G01V 1/46* (2006.01)
  *G01V 1/50* (2006.01)
(52) U.S. Cl.
  CPC .. *G01V 2200/16* (2013.01); *G01V 2210/1216* (2013.01)

(56) References Cited

U.S. PATENT DOCUMENTS

| | | | |
|---|---|---|---|
| 4,625,555 A | 12/1986 | Fujii | |
| 4,958,125 A * | 9/1990 | Jardine | E21B 12/02 |
| | | | 73/152.59 |
| 5,131,477 A * | 7/1992 | Stagg | E21B 47/04 |
| | | | 73/152.58 |
| 5,176,631 A | 1/1993 | Koenig et al. | |
| 5,178,005 A | 1/1993 | Peterson | |
| 5,243,855 A | 9/1993 | Steiger et al. | |
| 5,265,461 A | 11/1993 | Steiger et al. | |
| 5,673,697 A | 10/1997 | Bryan et al. | |
| 5,678,643 A | 10/1997 | Robbins et al. | |
| 5,691,475 A | 11/1997 | Marsala | |
| 5,753,812 A | 5/1998 | Aron et al. | |
| 5,868,030 A | 2/1999 | Brumley et al. | |
| 6,382,332 B1 | 5/2002 | Eaton | |
| 6,988,566 B2 | 1/2006 | Lockerd, Sr. et al. | |
| 7,289,909 B2 | 10/2007 | Thomamnn et al. | |
| 7,404,456 B2 | 7/2008 | Weaver et al. | |
| 7,823,451 B2 | 11/2010 | Sarr | |
| 9,074,467 B2 | 7/2015 | Yang et al. | |
| 9,103,192 B2 | 9/2015 | Yang | |
| 9,234,974 B2 | 1/2016 | Yang | |
| 9,341,731 B2 * | 5/2016 | Biswas | G01V 1/50 |
| 9,447,681 B2 | 9/2016 | Yang | |
| 9,568,629 B2 | 2/2017 | Almarhoon et al. | |
| 9,684,087 B2 * | 6/2017 | Yang | G01N 29/32 |
| 9,903,974 B2 | 2/2018 | Yang | |
| 10,180,061 B2 | 1/2019 | Yang | |
| 10,519,769 B2 | 12/2019 | Havens et al. | |
| 10,551,516 B2 | 2/2020 | Yang | |
| 10,772,607 B2 | 9/2020 | Guiles | |
| 10,851,641 B2 | 12/2020 | Yang et al. | |
| 10,920,574 B1 | 2/2021 | Yang et al. | |
| 2011/0266058 A1 | 11/2011 | Kumar et al. | |
| 2013/0075160 A1 | 3/2013 | Yang | |
| 2013/0080060 A1 | 3/2013 | Yang | |
| 2013/0080065 A1 | 3/2013 | Yang | |
| 2014/0005853 A1 | 1/2014 | Chen et al. | |
| 2014/0195844 A1 * | 7/2014 | Laval | G05B 23/0272 |
| | | | 713/340 |
| 2015/0184508 A1 * | 7/2015 | Huang | E21B 7/061 |
| | | | 703/6 |
| 2015/0309196 A1 * | 10/2015 | Yang | G01V 1/50 |
| | | | 367/30 |
| 2017/0067337 A1 | 3/2017 | Havens et al. | |
| 2017/0153343 A1 | 6/2017 | Almarhoon et al. | |
| 2017/0276649 A1 | 9/2017 | Schmitz et al. | |
| 2018/0203148 A1 * | 7/2018 | Skelton | G01V 1/284 |
| 2018/0283160 A1 * | 10/2018 | Ng | E21B 44/02 |
| 2018/0284309 A1 | 10/2018 | Hirabayashi et al. | |
| 2019/0072685 A1 * | 3/2019 | Yang | G01V 1/168 |
| 2020/0056470 A1 * | 2/2020 | Ng | E21B 3/022 |
| 2020/0166662 A1 * | 5/2020 | Yang | G01V 1/168 |
| 2021/0389492 A1 * | 12/2021 | Yang | G01V 1/46 |

FOREIGN PATENT DOCUMENTS

| | | |
|---|---|---|
| EP | 0294158 | 12/1993 |
| EP | 2930507 | 10/2015 |
| WO | WO 2003027663 | 4/2003 |
| WO | WO 2013049014 | 4/2013 |
| WO | WO 2013049111 | 4/2013 |
| WO | WO 2013049140 | 4/2013 |
| WO | WO 2020097090 | 5/2020 |
| WO | WO 2021257378 | 12/2021 |

OTHER PUBLICATIONS

C. Gradl and et al, "An Analysis of Noise Characteristics of Drill Bits", 2008 SPE Annual Technical Conference and Exhibition held in Denver, Colorado, USA, Sep. 21-24, 2008 (Year: 2008).*

M. Qin and et al, "Analysis of signal characteristics from rock drilling based on vibration and acoustic sensor approaches", Applied Acoustics 140 (2018) 275-282 (Year: 2018).*

Corelab.com [online], "Advanced Rock Properties: Acoustic Velocity System, AVMS-350HT," available on or before Jun. 18, 2017, [retrieved on May 22, 2018], retrieved from URL: <http://www.corelab.com/cli/advanced-rock-properties/acoustic-velocity-system>, 2 pages.

Gemmeke and Ruiter, "3D Ultrasound computer tomography for medical imaging," Nuclear Instruments and Methods in Physics Research A, 580:2, Oct. 1, 2007, 9 pages.

Johnson, "Design and Testing of a Laboratory Ultrasonic Data Acquisition System for Tomography," thesis for degree of Master of Science in Mining and Minerals Engineering, Virginia Polytechnic Institute and State University, Dec. 2, 2004, 108 pages.

Macpherson et al., "Measurement of Mud Motor Rotation Rates using Drilling Dynamics," presented at the SPE/IADC Drilling Conference, Amersterdam, The Netherlands, Feb. 27-Mar. 1, 2001, 10 pages.

Masood et al., "A Critical Review on Estimation of Rock Properties Using Sound Levels Produced during Rotary Drilling," International Journal of Earth Sciences and Engineering, Dec. 2012, 1809-1814, 6 pages.

Rector III et al., "Radiation Pattern and Seismic Waves Generated by a Working Roller-Cone Drill Bit," Geophysics, Society of Exploration Geophysicists, 57:10 (1319-1333), Oct. 1992, 15 pages.

Ruiter et al., "3D ultrasound computer tomography of the breast: A new era?" European Journal of Radiology 81S1, Sep. 2012, S133-S134, 11 pages.

Soma et al., "Trial of Coal Seam Imaging by Cross Correlation Analysis of Drilling Noise at Open-Pit Mine Based on Single Point 3C Downhole Observation," Proceedings of the 11th SEGJ International Symposium; Yokohama, Japan; Nov. 18-21, 2013, 302-306, 5 pages.

Zborovjan et al., "Acoustic Identification of Rocks during Drilling Process," Acta Montanistica Slovaca, Dec. 1, 2003, 191-193, 3 pages.

PCT International Search Report and Written Opinion in International Appln. No. PCT/US2023/010682, dated Apr. 3, 2023, 13 pages.

* cited by examiner

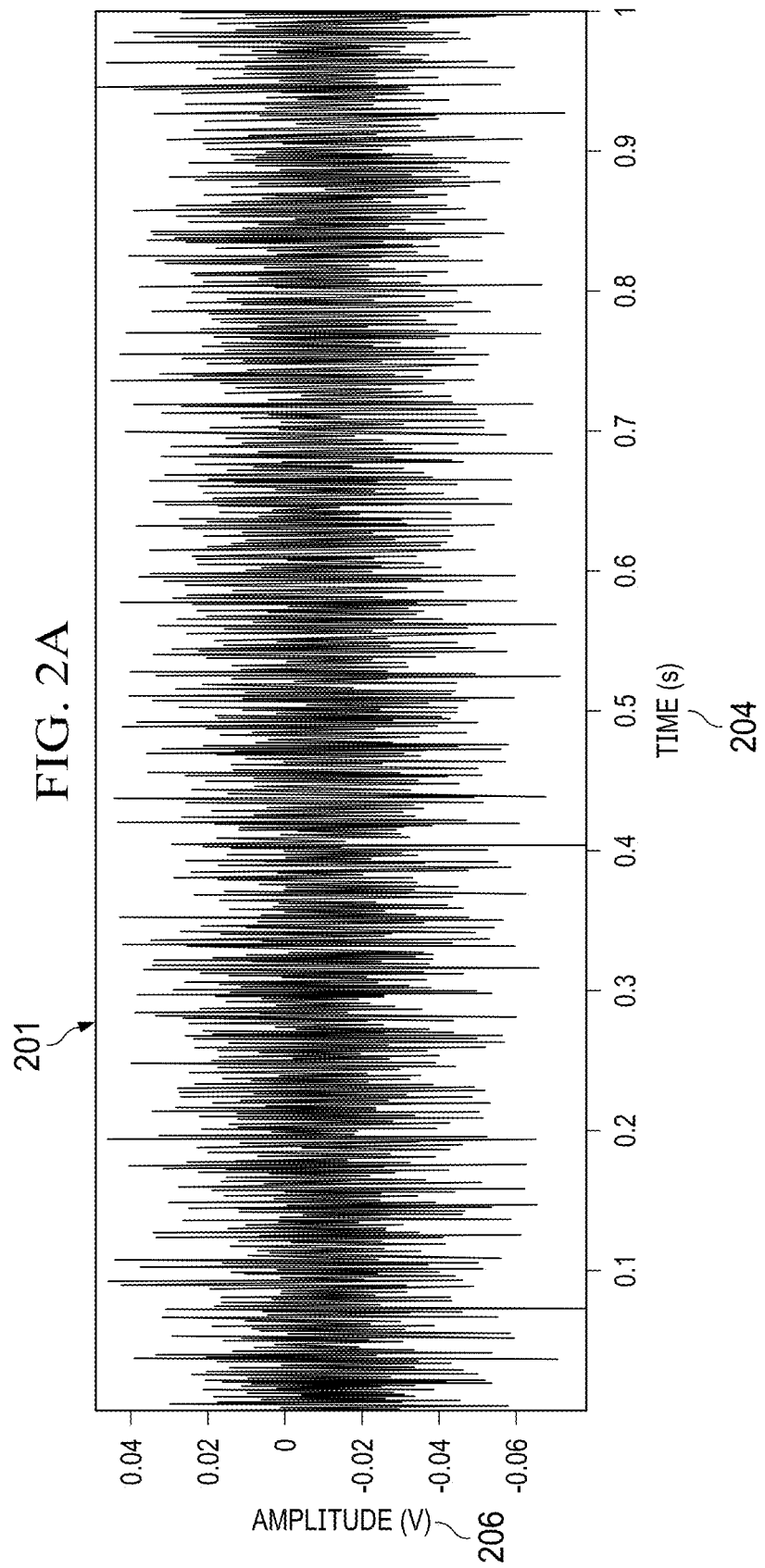

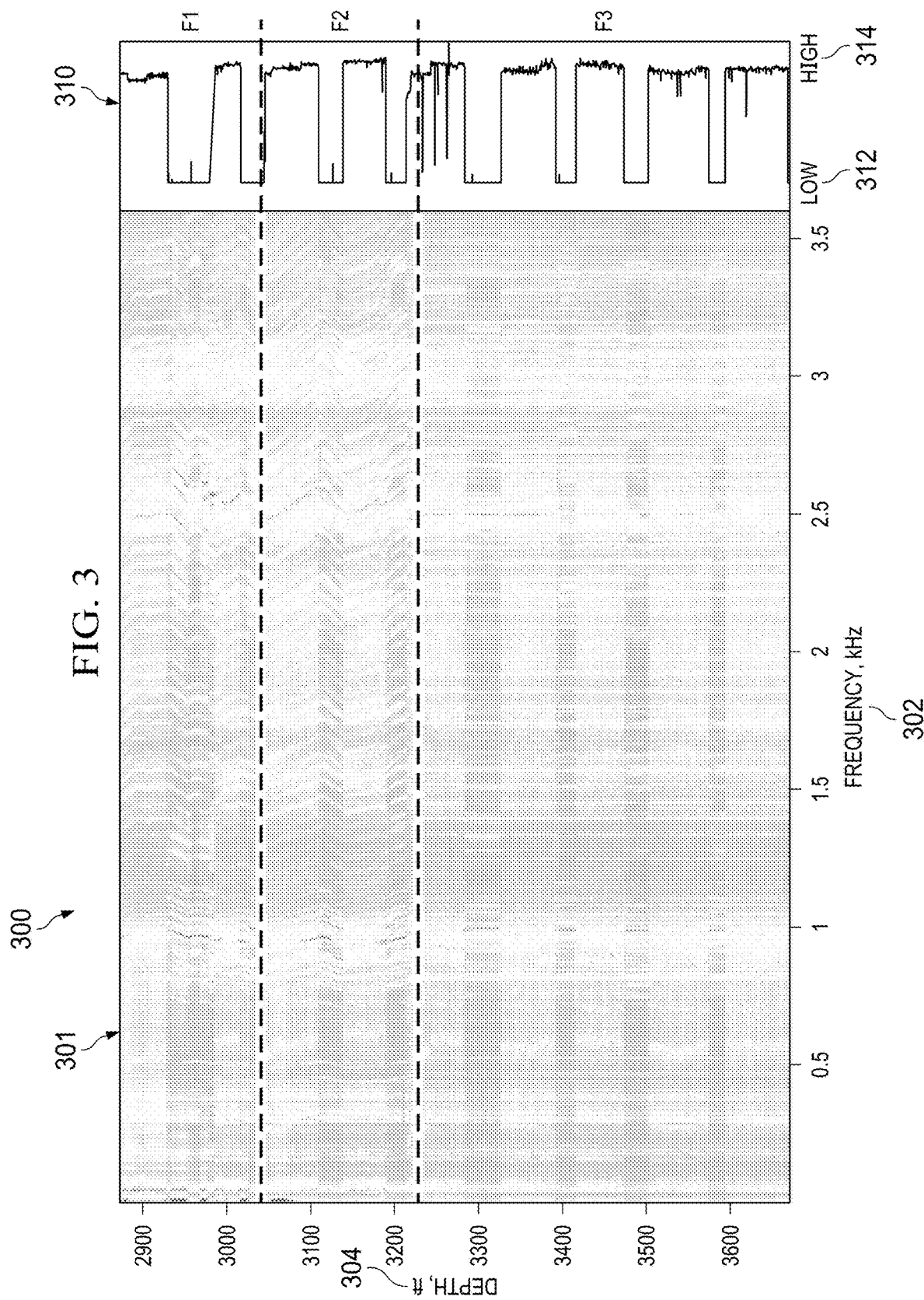

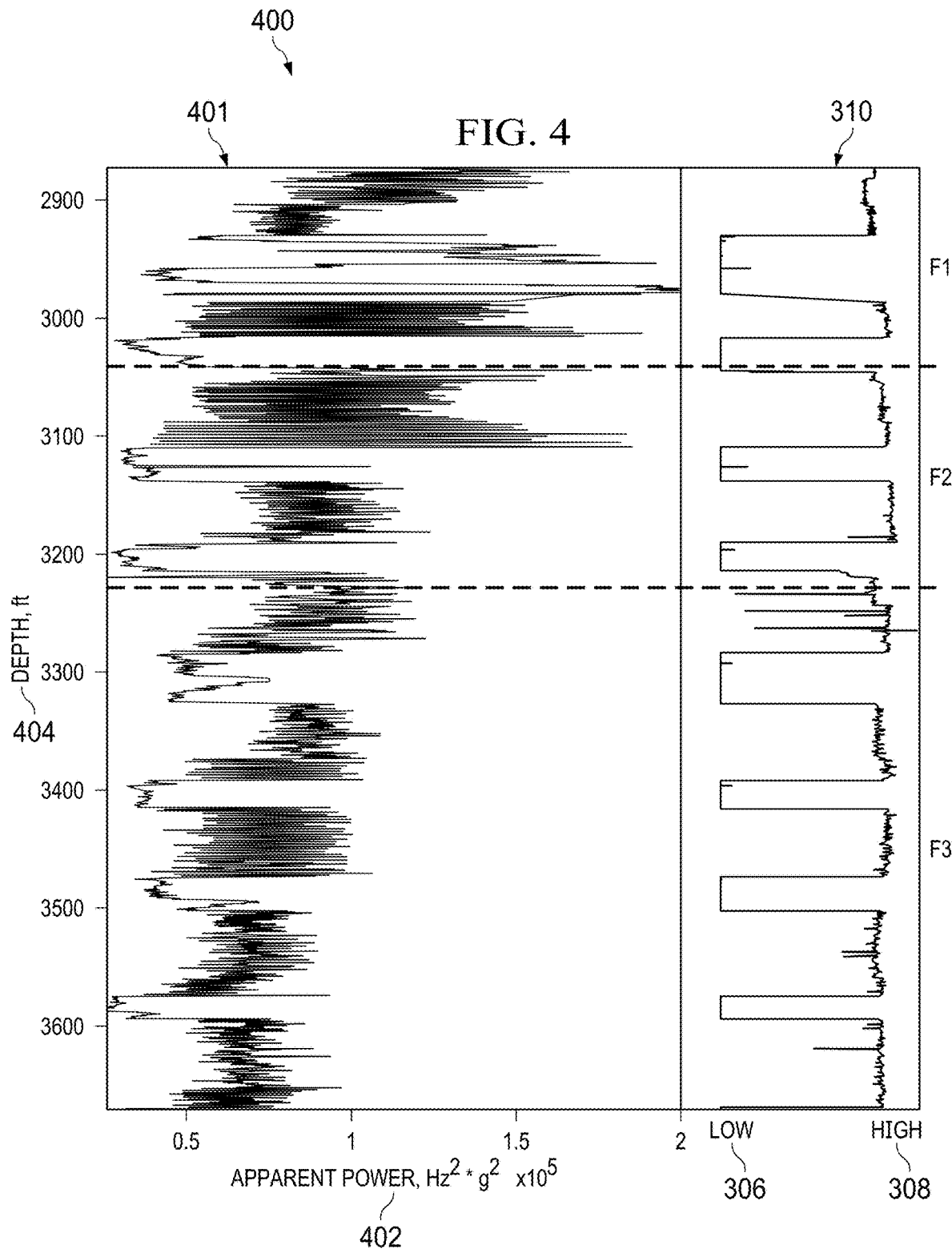

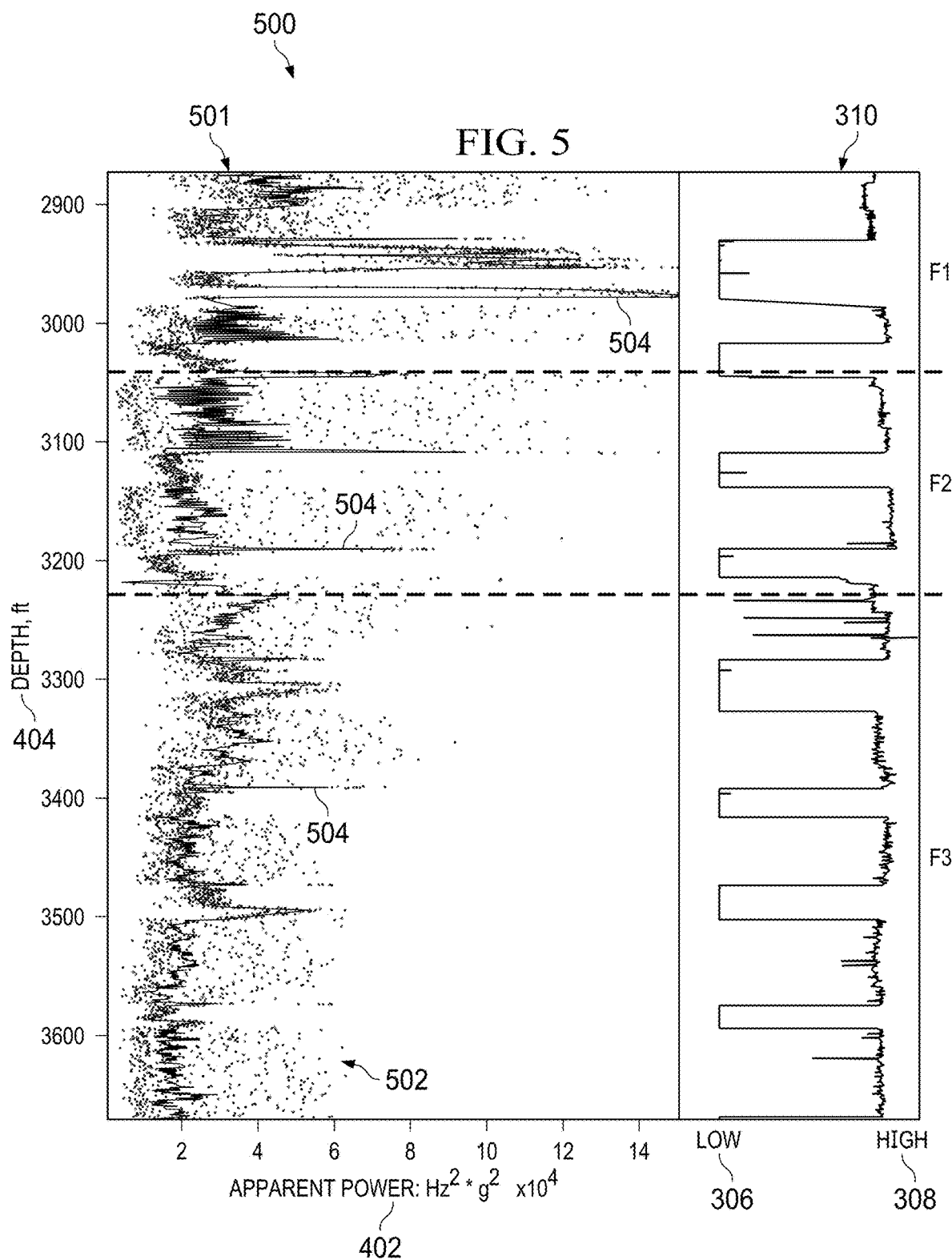

ically significant frequency range. The normalized apparent power is a measure of the power of the drilling acoustic signals and it is a function of the amplitude and frequency of the normalized FFT data. The lithological significant frequency range is a frequency range within which the drill sounds are more closely related with lithology.

MINIMIZATION OF DRILL STRING ROTATION RATE EFFECT ON ACOUSTIC SIGNAL OF DRILL SOUND

TECHNICAL FIELD

The present disclosure applies in general to hydrocarbon production, and more particularly, to identifying rock types and rock properties in order to improve and enhance drilling operations.

BACKGROUND

In drilling operations, drill sounds are generated from a drill bit engaging rock under drilling. The particular drill sounds that are generated can depend on lithology properties, such as lithology type. In some cases, the drill sounds can be recorded and processed in real time for applications such as geo-steering, boundary detection, and casing shoe positioning. Drill string rotation rates can also affect significantly drill sounds. To maximize the extraction of lithological information, the effect that a drill string rotation rate has on recorded drill sounds needs to be minimized.

SUMMARY

The present disclosure describes techniques that can be used for minimizing drill string rotation rate effects on recorded drill sounds and for deriving a lithology-indicating parameter from the processed drill sound. In some implementations, a computer-implemented method includes the following. Drilling acoustic signals that are generated during drilling of a well are received. The drilling acoustic signals correspond to a time domain. A fast Fourier transformation (FFT) is performed using the drilling acoustic signals to generate FFT data. Normalized FFT data is generated by normalizing the FFT data using normalization parameters. The drill string rotation rate of the drill string is received during drilling of the well. The normalized apparent power is determined from data points of a predetermined top percentage of the normalized FFT data within a lithological significant frequency range. The normalized apparent power is a measure of the power of the drilling acoustic signals and it is a function of the amplitude and frequency of the normalized FFT data. The lithological significant frequency range is a frequency range within which the drill sounds are more closely related with lithology.

The previously described implementation is implementable using a computer-implemented method; a non-transitory, computer-readable medium storing computer-readable instructions to perform the computer-implemented method; and a computer-implemented system including a computer memory interoperably coupled with a hardware processor configured to perform the computer-implemented method, the instructions stored on the non-transitory, computer-readable medium.

The subject matter described in this specification can be implemented in particular implementations, so as to realize one or more of the following advantages. Drill string rotation effects can be minimized, which can help to maximize the extraction of lithological information from drill bit sounds that are recorded and processed.

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

DESCRIPTION OF DRAWINGS

FIG. 2A is a graph showing an example of recorded drilling acoustic signal data, according to some implementations of the present disclosure.

FIG. 3 is a plot showing an example of signal plot in fast Fourier transformation (FFT) format recorded during the drilling of an oil well, according to some implementations of the present disclosure.

FIG. 4 is a diagram showing an example of apparent power, according to some implementations of the present disclosure.

FIG. 5 is a graph showing an example of a normalized apparent power plot, according to some implementations of the present disclosure.

Like reference numbers and designations in the various drawings indicate like elements.

DETAILED DESCRIPTION

Figure 1:
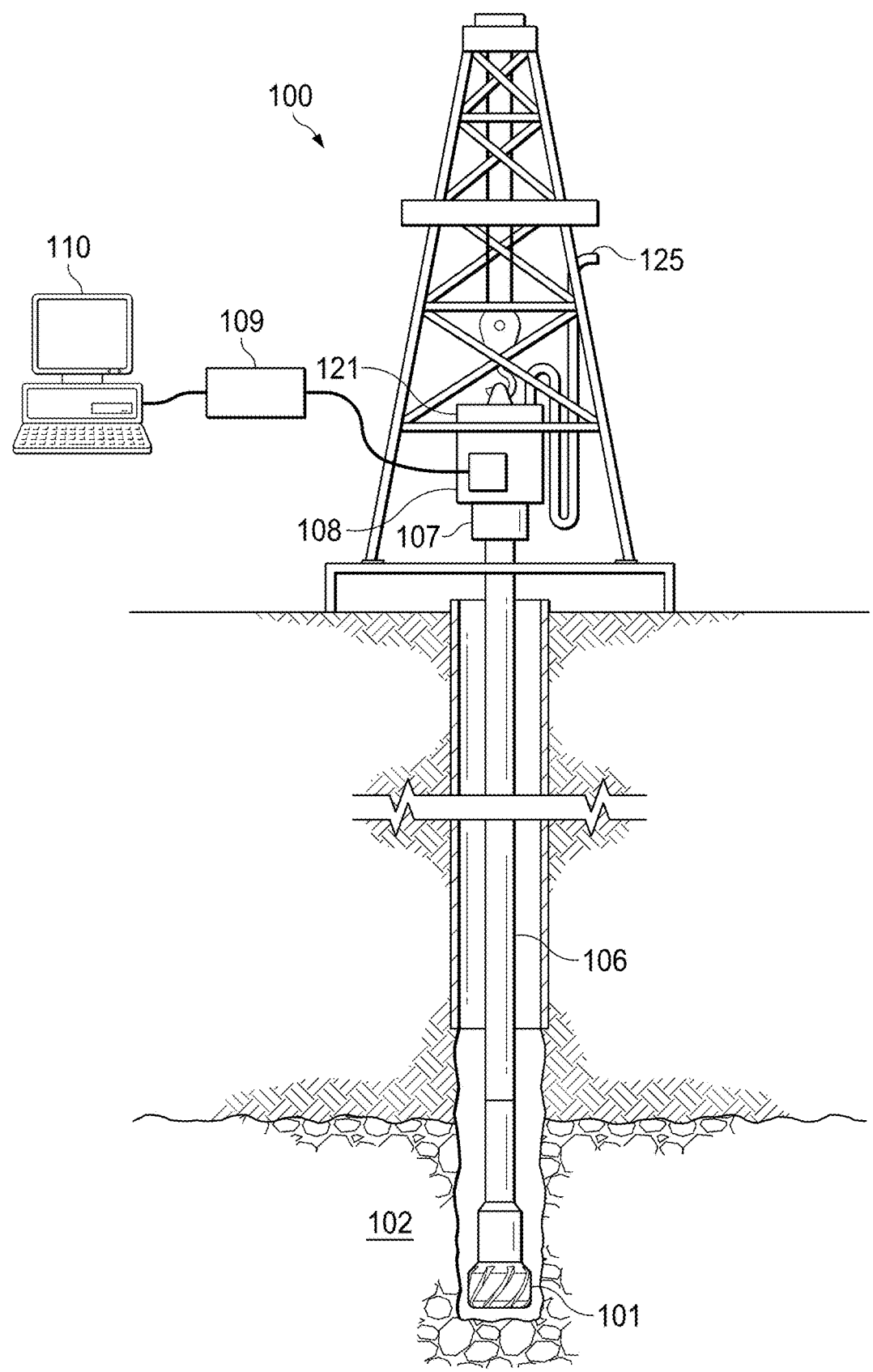
FIG. 1 is a schematic diagram showing an example of a drill rig with an attached drill sound recording system, according to some implementations of the present disclosure.

The following detailed description describes techniques for minimizing drill string rotation effects on recorded drill sound and for deriving a lithology-indicating parameter from the processed drill sound. Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

Measuring rock properties (such as rock type) at the drill bit during drilling in real time can provide the operator with the ability, for example, to steer a drill bit in the direction of desired hydrocarbon concentrations. Measuring rock properties can also enable the operator to precisely position casing shoes by knowing rock boundaries. Some types of systems attempt to provide data at the drill bit in real-time during drilling. Drill sounds can be recorded that result from the drill bit engaging rock during drilling operations. The recording can make use of acoustic sensors attached to either drive shaft extensions of a drill rig (on the surface) or to a downhole subassembly adjacent to the drill bit of a drill rig. It was observed through field tests that drill sounds are not only affected by the lithology under drilling, but also by rotation rate of the drill string. Therefore, techniques are needed to minimize the effects of drill string rotation rates on drill sounds and to derive parameters indicating rock physical properties from the processed drill sounds after minimization of the drill string rotation rate effect.

The present disclosure describes techniques for minimizing the effects of drill string rotation rates on recorded drill sounds. First, drill sounds recorded in time domain is transformed into frequency domain data by applying a Fast Fourier Transformation (FFT). Second, the FFT data is input into an FFT Data Normalization function to minimize the effects of drill string rotation rates. The FFT Data Normalization function can contain several equations and can output Normalized FFT Data, which is FFT data resulting from minimization of drill string rotation rate effects. Third, a lithology indicating parameter Normalized Apparent Power is calculated from Significant Data Points of the Normalized FFT Data within a Lithological Significant Frequency Range. Significant Data Points are data points of pre-determined top percentage (x %) (in terms of amplitude) of a normalized FFT sample, which contain less background noise. The Lithological Significant Frequency Range is a frequency range within which drill sounds are more closely related with lithology.

FIG. 1 is a schematic diagram showing an example of a drill rig 100 with an attached drill sound recording system, according to some implementations of the present disclosure. The drill rig 100 can support a system for generating and recording drill sounds, including the rotation of the drill string. The drill rig 100 can use a drill bit 101 to drill an oil or gas well, including cutting through into the rock beneath. The cutting is conducted through the rotation of the drill bit 101. The rotation of the drill bit 101 can be provided by a top drive 121 through a drive shaft 107 and then a drill string 106. Drilling mud 125 is used to carry cuttings out of the hole.

When drilling is performed into different lithologies or into the same lithology with different properties (e.g., porosity, presence of hydrocarbons, presence of fractures, etc.) with a drill rig 100, the generated drill sounds emanating from the drill bit 101 and the contacted rock 102 can be distinctly different. The drill sounds transmit upward along the drill string 106. As is the case in conventional systems, the drill sounds can be picked up by one or more acoustic sensors 108 attached directly to the drive shaft 107. The drill sounds can alternatively be picked up by an extension of the drive shaft of a drill rig on surface or by a downhole subassembly adjacent to the drill bit. The drill sounds picked up by the sensors can be digitized by a data acquisition unit 109. The digitized data can be transmitted to a computer 110 to be recorded. The data acquisition unit 109 and the computer 110 can be implemented using features of the computer system 800, for example. The recorded drill sounds are termed as drilling acoustic signals hereafter.

FIG. 2A is a graph showing an example of recorded drilling acoustic signal data 201, according to some implementations of the present disclosure. For example, the drilling acoustic signal data 201 is a drilling acoustic signal sample in a time domain with an amplitude 206 (e.g., in volts (v)) recorded in time 204, for example, in seconds (s).

Figure 2B:
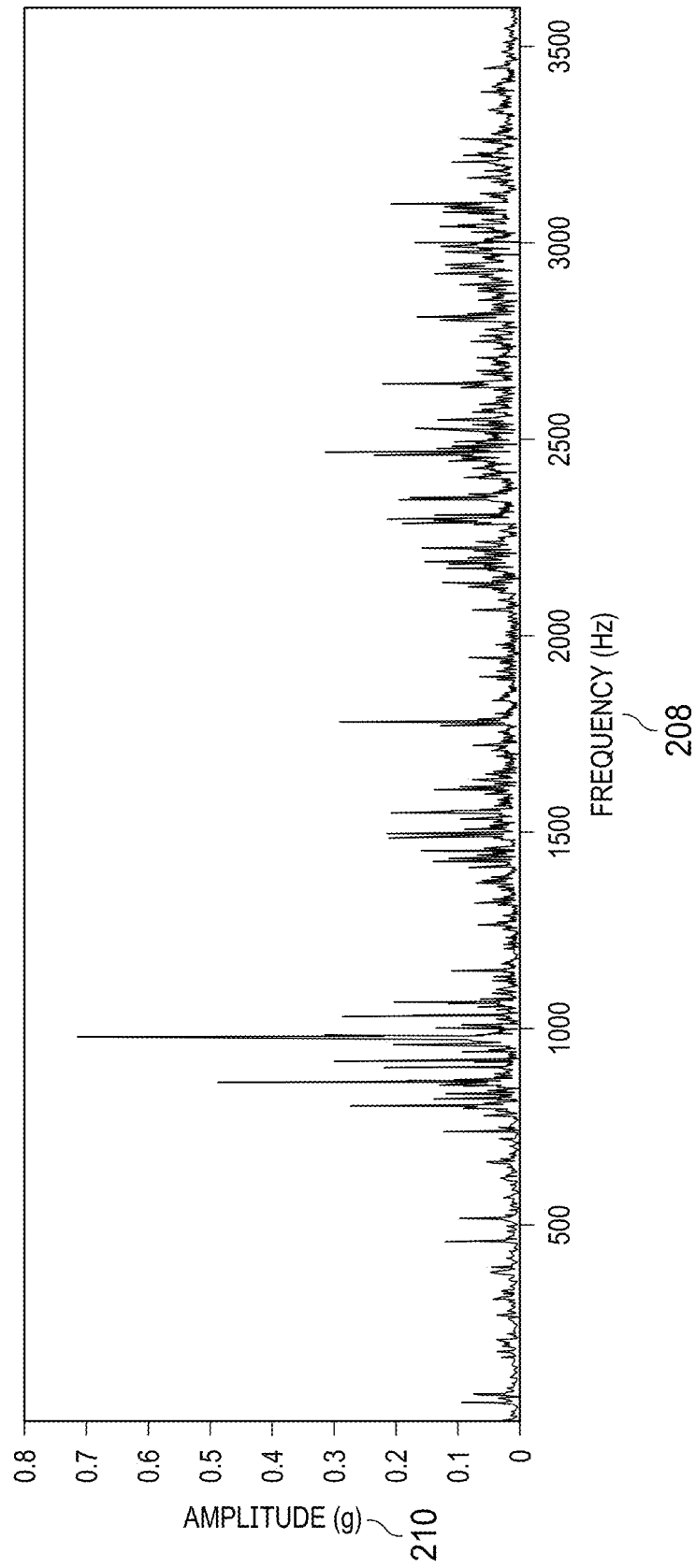
FIG. 2B is a graph showing an example of frequency domain data, according to some implementations of the present disclosure.

FIG. 2B is a graph showing an example of frequency domain data 203, according to some implementations of the present disclosure. The signals of FIG. 2A are normally transformed by using a Fast Fourier Transformation into frequency domain data 203 (or simply, FFT data 203 or an FFT sample 203) for analysis. The FFT data 203 has a frequency 208 (e.g., in Hertz) and an amplitude 210 (e.g., in meters per second squared (g)) information of a sampled acoustic signal. The sample is termed an FFT drilling acoustic signal sample or simply an FFT sample for simplicity in the present disclosure.

The FFT data 203 can be plotted relative to drilling depth. An example of such signal displaying diagram (signal plot 301) is shown in FIG. 3, which was recorded on an oil well drill rig during a drilling operation. On the signal plot 301, the shading represents amplitude, with dark shading indicating the lowest.

FIG. 3 is a graph 300 showing an example of a signal plot 301 in FFT format recorded during the drilling of an oil well, according to some implementations of the present disclosure. The plot is plotted relative to frequency 302 (e.g., in kiloHertz (kHz)) and depth 304 (e.g., in feet (ft)). On the diagram, the amplitude of the signals is represented by shading. The drill string rotation rate 310 is also plotted alongside the plot, with a ration rate in a range between a low 312 and a high 314. The value of the drill string rotation rate 310 varies from low to high. Signals in the signal plot 301 of FIG. 3 were recorded in three rock formations. Formation 1 (F1) is composed of limestone and clastic sedimentary rocks. Formations F2 and F3 have similar lithology types—limestone, but with different physical properties, such as porosity and strength. As shown in FIG. 3 for these three rock formations, the drilling acoustic signal data in FFT format are different, a reflection of the effects of lithology type and properties.

Experimentation

Examination of the signal plot 301 of FIG. 3 shows a strong-weak-strong-weak pattern along depth. It was determined during testing that the pattern is caused by the rotation rate of the drill string 106, which rotates drill bit 101 during drilling (FIG. 1). When the drill string rotation rate 310 is plotted beside the signal plot 301 of FIG. 3, it is clear that the relative low amplitude sections correspond to the low rotation rate of the drill string, and high amplitude sections to the high rotation rate. In conclusion, the drilling acoustic signals are affected not only by the properties (such as type) of the rock under drilling, but also by the drill string rotation rate.

To help to capture lithological properties of the rock under drilling, some characteristics can be derived from the drilling acoustic signals. An example lithology indicating-parameter, apparent power $P_a$, is defined by Equation (1):

$$P_a = \sum_{i=1}^{n} A_i^2 f_i^2 \quad (1)$$

where $P_a$ is the apparent power of a drilling acoustic signal sample (described with reference to FIG. 2), the unit depending on the type of acoustic sensor used in the measurement; n is number of data points of the drilling acoustic signal sample; $f_i$ is the frequency of the $i^{th}$ point of the acoustic signal sample, e.g., in Hz; $A_i$ is the amplitude of the $i^{th}$ point of the acoustic signal sample, with the units depending on the type of acoustic sensor used in the measurement.

FIG. 4 is a diagram 400 showing an example of apparent power 401, according to some implementations of the present disclosure. The apparent power 401 is plotted relative to an apparent power axis 402 (e.g., in Hz² g²·10⁵) and a depth axis 404 (e.g., in feet). The apparent power 401 is derived from a drilling acoustic signal record (shown as the signal plot 301 of FIG. 3) by using Equation (1). The value of the drill string rotation rate 310 varies from low to high and is plotted relative to the depth axis 404. Since drilling acoustic signals are affected by the drill string rotation rate, the apparent power should be affected by the drill string rotation rate. Comparisons between the derived apparent power 401 and the drill string rotation rate show that the apparent power 401 is affected by the drill string rotation rate 310. The higher the drill string rotation rate, the higher the apparent power.

Minimizing Effects of Drill String Rotation Rate

To maximally extract lithological information, the drill string rotation rates' effect should be minimized. The present disclosure describes a method to minimize the drill string rotation rate effect on a drilling acoustic signal record (signal plot 301) and the apparent power 401.

As discussed previously, drilling acoustic signals are positively affected by drill string rotation rates. That is, the amplitude of drilling acoustic signals is positively related to the drill string rotation rate. Therefore the method disclosed in the present disclosure is designed based on the understanding that the effect of the drill string rotation rate is minimized by reducing the amplitude of the drilling acoustic signal by a certain amount which is positively dependent on the drill string rotation rate. This certain amount of amplitude is termed as amplitude adjustment. Based on this understanding, the following formulas are developed to minimize the effect of the drill string.

The amplitude adjustment A' for an FFT sample 203 (in FIG. 2) is a function of an amplitude percentile of the FFT sample 203 and an adjustment factor, given in Equation (2):

$$A' = A_{Per} \cdot F \quad (2)$$

where A' is an amplitude adjustment, $A_{Per}$ is a percentile-based amplitude determined from percentage Per of the FFT sample 203, Per is a predetermined percentage of the normalized FFT data within a lithological significant frequency range calculated from the drill string rotation rate, and F is an adjustment factor.

Both the amplitude percentage Per and factor F are a function of the drill string rotation rate:

$$Per = Per_0 + C_P \cdot R_D \quad (3)$$

$$F = F_0 + C_F \cdot R_D \quad (4)$$

where percentage $Per_0$, constant $C_P$, factor $F_0$, and constant $C_F$ are constants for a drilling acoustic signal record of the signal plot 301, and $R_D$ is a drill string rotation rate of the FFT sample 203.

The drill string rotation rate effect of an FFT sample 203 in a record corresponding to the signal plot 301 can be minimized. The resulting sample and record after the minimization of the drill string rotation rate effect are termed Normalized FFT Sample and Normalized FFT Record, respectively. Minimization for a sample is done by applying Equation (5):

$$A_{N_i} = A_i - A', \text{ if } A_i > A'$$

$$A_{N_i} = 0, \text{ if } A_i \leq A' \quad (5)$$

where $A_i$ is an amplitude of the $i^{th}$ point of the acoustic signal sample (e.g., FFT sample 203), and $A_{N_i}$ ($A_i \geq 0$) is an amplitude of the $i^{th}$ point of the acoustic signal sample after normalization (minimization of the drill string rotation rate effect).

The four constants in the Equations (3) and (4) can be adjusted or optimized for a specific drilling acoustic signal record using inputs or selections from a user in a normalization process for minimizing the drill string rotation rate effect on the drilling acoustic signal. The four constants can be optimized (optimally decided) when the drill string rotation rate effect is minimized by checking the normalized apparent power against the drill string rotation rate (FIGS. 4 and 5).

In summary, for each sample in a drilling acoustic signal record (the signal plot 301), a percentage Per and an adjustment factor F are calculated from the drill string rotation rate $R_D$ by using Equations (3) and (4). An amplitude percentile Aver at the percentage Per can be derived from the sample. The definition of percentile and the evaluation of a percentile are readily understood by those skilled in the art. The amplitude adjustment A' for the sample can be calculated by using Equation (2) from the percentile and the adjustment factor. The drill string rotation rate effect for each of the data point of the sample can be minimized by using Equation (5) to produce a normalized FFT sample. When all the samples in a drilling acoustic signal record (the signal plot 301) are processed to minimize the drill string rotation effect, a normalized FFT record is generated.

A normalized FFT record can be further processed by applying Equation (1) to derive a normalized apparent power. To maximally capture lithology information, two considerations are taken in the derivation of a normalized apparent power.

The first consideration focuses on frequency range within which the normalized apparent power is evaluated. Recorded drilling acoustic signals in some frequency ranges can be more related to background noise or the drilling environment. For example, signals associated with the signal plot 301 with a frequency >3600 Hz can be attributed to background noise, since the signals do not vary with the formations. Within a certain frequency range, drilling acoustic signals are more closely related with lithology. The signals within this certain frequency range should be used in the evaluation for lithology types and properties. This range is termed Lithological Significant Frequency Range. The normalized apparent power is derived within a Lithological Significant Frequency Range.

The second consideration focuses on significant data points from which a normalized apparent power is evaluated for a normalized FFT sample. In a drilling acoustic signal record, background noise exists. The signal plot 301 of FIG. 3 shows that some data points are distinctive and change regularly along depth. These are considered signals. Between these distinctive signals, there are non-distinctive, smearing data points with low amplitudes. With these low amplitudes, smearing data points are considered background noise. In the present disclosure, data points of a top percentage (X %) (in terms of amplitude) of a normalized FFT sample are considered Significant Data Points, contain less background noise and are included in the derivation of an apparent power.

In summary, a Normalized Apparent Power is derived within a Lithology Significant Frequency Range and from Significant Data Points of a normalized FFT sample. The Lithological Significant Frequency Range and Significant Data Points are determined by checking the correlation of the normalized apparent power with lithology properties, such as lithology type; or with other lithology indicating well logs, such as gamma ray logs. The Lithology Significant Frequency Range and the top percentage are constants for a given drilling acoustic signal record.

FIG. 5 is a graph 500 showing an example of a normalized apparent power plot 501, according to some implementations of the present disclosure. The normalized apparent power plot 501 can be derived from a drilling acoustic signal record (the signal plot 301 of FIG. 3) by using the techniques described in the present disclosure. Black dots 502 are the derived normalized apparent power. Line 504 is the moving median of the derived normalized apparent power plot 501. The line 504 provides a better visual representation of a trend that is provided by the raw data.

Comparison between the raw apparent power 401 (in FIG. 4) and the normalized apparent power plot 501 (in FIG. 5) shows the effectiveness of the minimization of the drill string rotation rate effect. In FIG. 4, the raw apparent power 401 changes with the drill string rotation rate 310. In other words, the apparent power is significantly affected by drill string rotation rates. In FIG. 5, the normalized apparent power plot 501 does not change with the drill string rotation rate 310. Comparison between the correlation between the raw apparent power 401 and the drill string rotation rate 310, and correlations between the normalized apparent power plot 501 and the drill string rotation rate 310 clearly show that the drill string rotation rate effect on the normalized apparent power has been effectively minimized.

Since the effect of the drill string rotation rate on the normalized apparent power has been effectively minimized, the normalized apparent power is much more effective and accurate indicator of lithology indicator than the raw apparent power. The Normalized FFT Data and the normalized apparent power can be used in derivation of lithological properties, such as lithology type, and can be applied in some real-time drilling operations, such as geo-steering, lithology boundary detection for casing shoe positioning.

Figure 6:
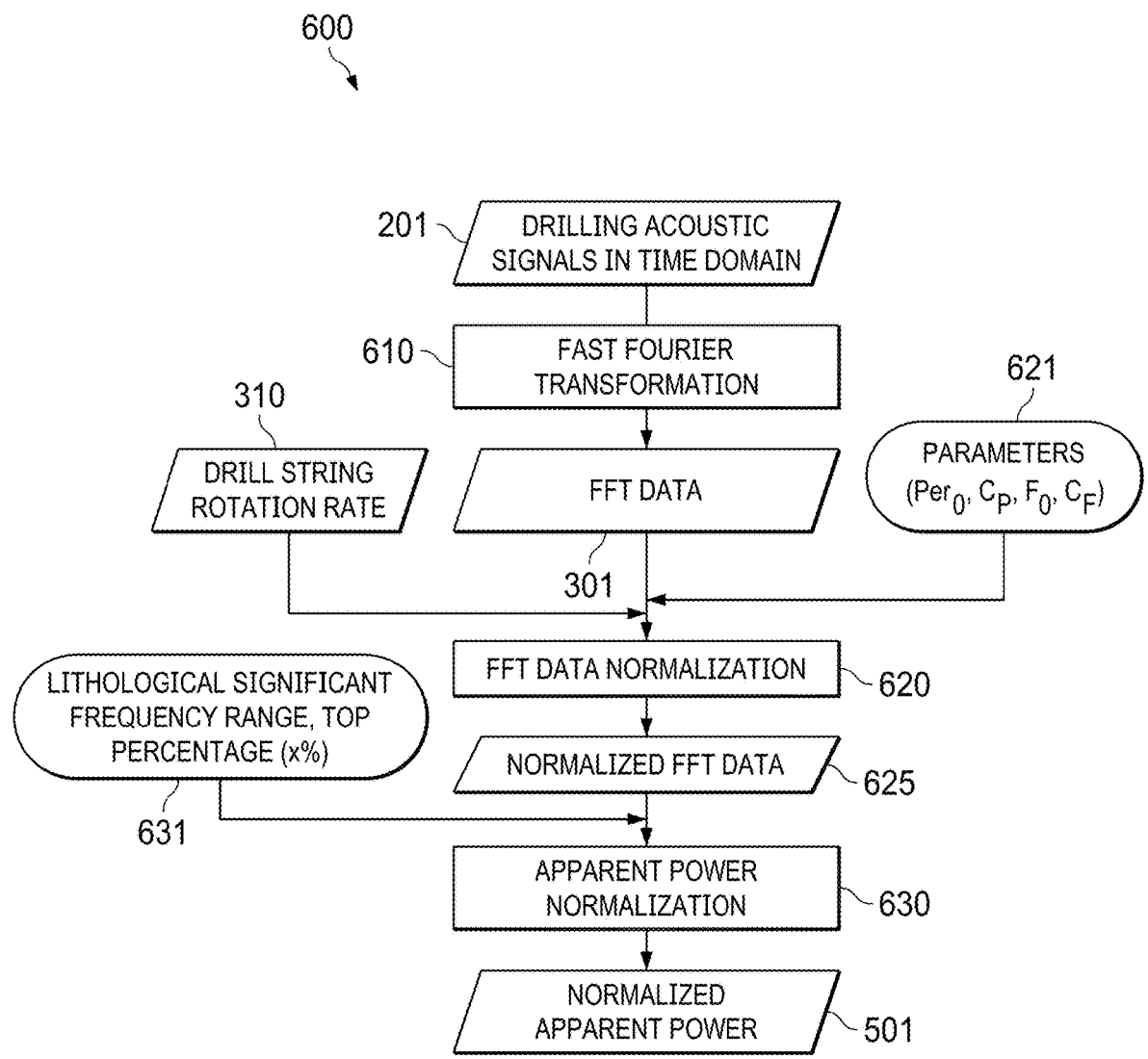
FIG. 6 is a flow diagram showing an example of a workflow for minimizing drill string rotation effects on drilling acoustic signals, according to some implementations of the present disclosure.

FIG. 6 is a flow diagram showing an example of a workflow 600 for minimizing drill string rotation effects on drilling acoustic signals, according to some implementations of the present disclosure. The workflow 600 can be used to minimize the effect of the drill string rotation rate on the drilling acoustic signals for a drilling acoustic signal record.

At 610, a drilling acoustic signal record (or data) in time domain 201 is transformed into a drilling acoustic signal record in a frequency domain (FFT data) 301 by applying a Fast Fourier Transformation Function. At 620, data from the FFT data 301 and a drill string rotation rate data record 310 are input into a FFT Data Normalization, along with some parameter constants 621, to generate a Normalized FFT Data set 625. In the FFT Data Normalization function 620, data are processed by execution of the Equations (3), (4), (2), and (5) in sequence. At 630, the Normalized FFT Data set 625, together with constants 631 (i.e., Lithological Significant Frequency Range and Top Percentage (X %)) are fed into an Apparent Power Normalization function to produce the normalized apparent power 501. For each sample in the Normalized FFT Data set 625, a normalized apparent power sample is calculated by using Equation (1) from the Top Percentage (X %) of the data points, within the specified Lithological Significant Frequency Range.

Figure 7:
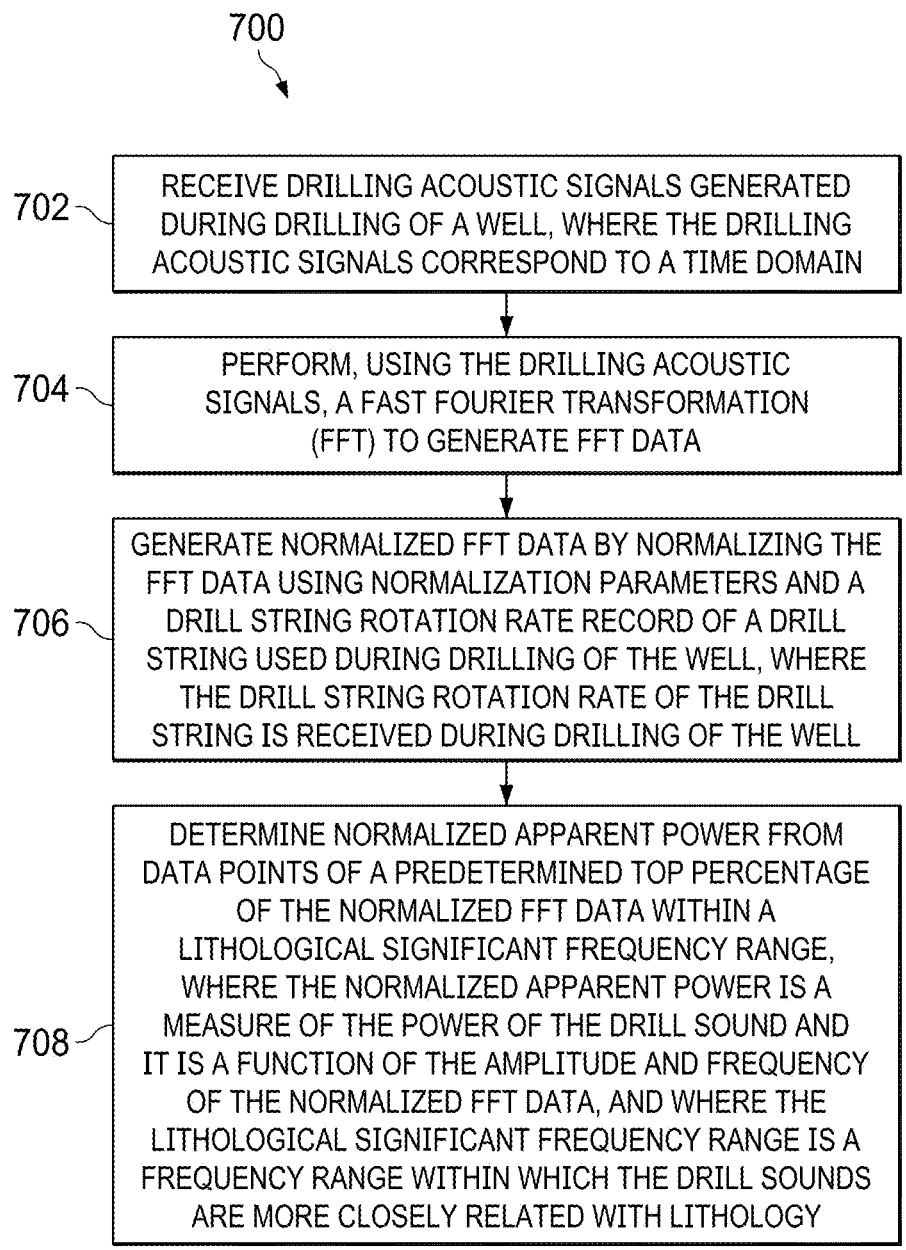
FIG. 7 is a flowchart of an example of a method for minimizing drill string rotation rate effects on recorded drill sounds and for deriving a lithology-indicating parameter from the processed drill sound, according to some implementations of the present disclosure.

FIG. 7 is a flowchart of an example of a method 700 for minimizing drill string rotation rate effects on recorded drill sounds and for deriving a lithology-indicating parameter from the processed drill sound, according to some implementations of the present disclosure. For clarity of presentation, the description that follows generally describes method 700 in the context of the other figures in this description. However, it will be understood that method 700 can be performed, for example, by any suitable system, environment, software, and hardware, or a combination of systems, environments, software, and hardware, as appropriate. In some implementations, various steps of method 700 can be run in parallel, in combination, in loops, or in any order.

At 702, drilling acoustic signals generated during drilling of a well are received, where the drilling acoustic signals correspond to a time domain. For example, the drilling acoustic signals can include recorded drill sounds, such as when drilling a well by the drill rig 100. From 702, method 700 proceeds to 704.

At 704, a fast Fourier transformation is performed, using the drilling acoustic signals to generate FFT data. For example, techniques described previously leading up to the generation of graph 301 of FIG. 3 can be used to generate the FFT data. From 704, method 700 proceeds to 706.

At 706, Normalized FFT Data is generated by normalizing the FFT data using normalization parameters and a drill string rotation rate of a drillstring used during drilling of the well, where the drill string rotation rate of the drillstring is received during drilling of the well. Normalization can be done using processes that include the use of Equations (2) to (5), for example. From 706, method 700 proceeds to 708.

At 708, normalized apparent power is determined from the Normalized FFT Data within a lithological significant frequency range, where the normalized apparent power is a measure of the power of the drill sound and it is a function of the amplitude and frequency of the Normalized FFT Data, and where the lithological significant frequency range is a frequency range within which the drill sounds are more closely related with lithology. The normalized apparent power can be determined from the data points of a predetermined top percentage of the Normalized FFT Data within the lithological significant frequency range by using Equation (1). After 708, method 700 can stop.

In some implementations, method 700 further includes generating, from the FFT data, a color-coded plot plotting signal amplitude versus depth and including an adjacent plot plotting drill string rotation in relation to the depth. For example, the techniques of the present disclosure can be used to generate the graph 300 that includes the signal plot 301 in FFT format recorded during the drilling of an oil well.

In some implementations, method 700 further includes updating, using selections from a user and based on a display of the normalized apparent power against the drill string rotation rate, of parameters used in determining the normalized apparent power. For example, a user can provide changes to parameters to study the effects of displayed information such as the graph 500 of FIG. 5.

In some implementations, in addition to (or in combination with) any previously-described features, techniques of the present disclosure can include the following. Customized user interfaces can present intermediate or final results of the above described processes to a user. The presented information can be presented in one or more textual, tabular, or graphical formats, such as through a dashboard. The information can be presented at one or more on-site locations (such as at an oil well or other facility), on the Internet (such as on a webpage), on a mobile application (or "app"), or at a central processing facility. The presented information can include suggestions, such as suggested changes in parameters or processing inputs, that the user can select to implement improvements in a production environment, such as in the exploration, production, and/or testing of petrochemical processes or facilities. For example, the suggestions can include parameters that, when selected by the user, can cause a change or an improvement in drilling parameters (including speed and direction) or overall production of a gas or oil well. The suggestions, when implemented by the user, can improve the speed and accuracy of calculations, streamline processes, improve models, and solve problems related to efficiency, performance, safety, reliability, costs, downtime, and the need for human interaction. In some implementations, the suggestions can be implemented in real-time, such as to provide an immediate or near-immediate change in operations or in a model. The term real-time can correspond, for example, to events that occur within a specified period of time, such as within one minute or within one second. In some implementations, values of parameters or other variables that are determined can be used automatically (such as through using rules) to implement changes in oil or gas well exploration, production/drilling, or testing. For example, outputs of the present disclosure can be used as inputs to other equipment and/or systems at a facility. This can be especially useful for systems or various pieces of equipment that are located several meters or several miles apart, or are located in different countries or other jurisdictions.

Figure 8:
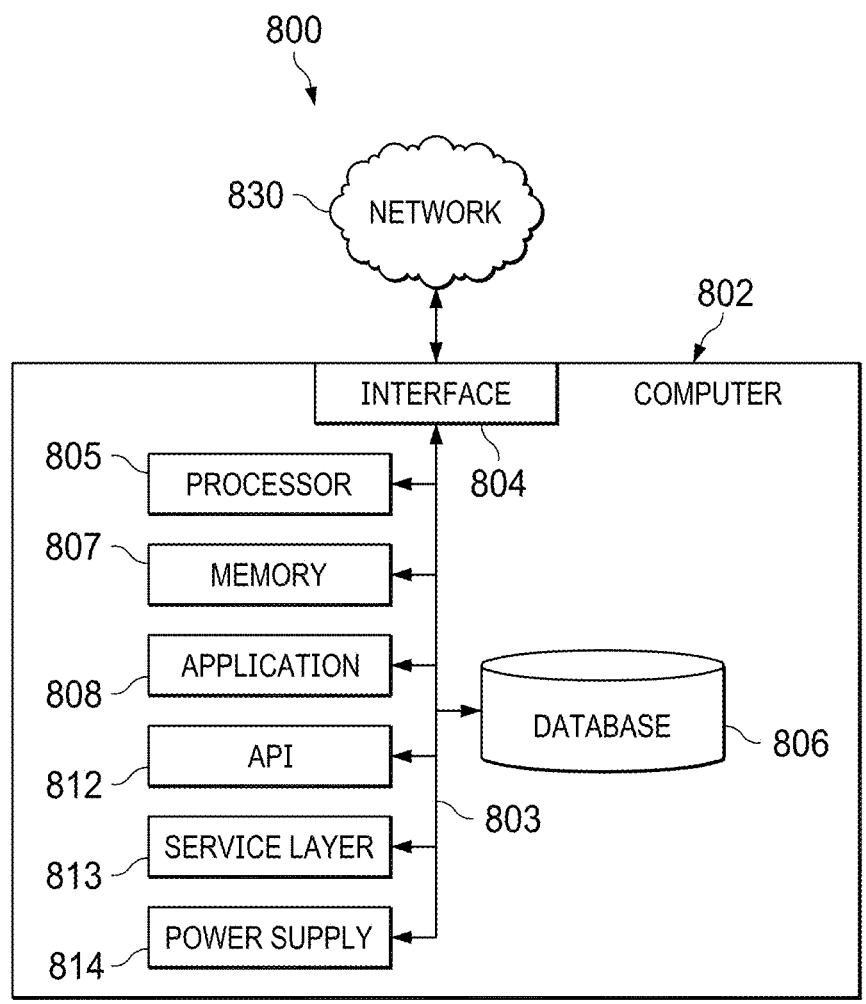
FIG. 8 is a block diagram illustrating an example computer system used to provide computational functionalities associated with described algorithms, methods, functions, processes, flows, and procedures as described in the present disclosure, according to some implementations of the present disclosure.

FIG. 8 is a block diagram of an example computer system 800 used to provide computational functionalities associated with described algorithms, methods, functions, processes, flows, and procedures described in the present disclosure, according to some implementations of the present disclosure. The illustrated computer 802 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 802 can include input devices such as keypads, keyboards, and touch screens that can accept user information. Also, the computer 802 can include output devices that can convey information associated with the operation of the computer 802. The information can include digital data, visual data, audio information, or a combination of information. The information can be presented in a graphical user interface (UI) (or GUI).

The computer 802 can serve in a role as a client, a network component, a server, a database, a persistency, or components of a computer system for performing the subject matter described in the present disclosure. The illustrated computer 802 is communicably coupled with a network 830. In some implementations, one or more components of the computer 802 can be configured to operate within different environments, including cloud-computing-based environments, local environments, global environments, and combinations of environments.

At a top level, the computer 802 is an electronic computing device operable to receive, transmit, process, store, and manage data and information associated with the described subject matter. According to some implementations, the computer 802 can also include, or be communicably coupled with, an application server, an email server, a web server, a caching server, a streaming data server, or a combination of servers.

The computer 802 can receive requests over network 830 from a client application (for example, executing on another computer 802). The computer 802 can respond to the received requests by processing the received requests using software applications. Requests can also be sent to the computer 802 from internal users (for example, from a command console), external (or third) parties, automated applications, entities, individuals, systems, and computers.

Each of the components of the computer 802 can communicate using a system bus 803. In some implementations, any or all of the components of the computer 802, including hardware or software components, can interface with each other or the interface 804 (or a combination of both) over the system bus 803. Interfaces can use an application programming interface (API) 812, a service layer 813, or a combination of the API 812 and service layer 813. The API 812 can include specifications for routines, data structures, and object classes. The API 812 can be either computer-language independent or dependent. The API 812 can refer to a complete interface, a single function, or a set of APIs.

The service layer 813 can provide software services to the computer 802 and other components (whether illustrated or not) that are communicably coupled to the computer 802. The functionality of the computer 802 can be accessible for all service consumers using this service layer. Software services, such as those provided by the service layer 813, can provide reusable, defined functionalities through a defined interface. For example, the interface can be software written in JAVA, C++, or a language providing data in extensible markup language (XML) format. While illustrated as an integrated component of the computer 802, in alternative implementations, the API 812 or the service layer 813 can be stand-alone components in relation to other components of the computer 802 and other components communicably coupled to the computer 802. Moreover, any or all parts of the API 812 or the service layer 813 can be implemented as child or sub-modules of another software module, enterprise application, or hardware module without departing from the scope of the present disclosure.

The computer 802 includes an interface 804. Although illustrated as a single interface 804 in FIG. 8, two or more interfaces 804 can be used according to particular needs, desires, or particular implementations of the computer 802 and the described functionality. The interface 804 can be used by the computer 802 for communicating with other systems that are connected to the network 830 (whether illustrated or not) in a distributed environment. Generally, the interface 804 can include, or be implemented using, logic encoded in software or hardware (or a combination of software and hardware) operable to communicate with the network 830. More specifically, the interface 804 can include software supporting one or more communication protocols associated with communications. As such, the network 830 or the interface's hardware can be operable to communicate physical signals within and outside of the illustrated computer 802.

The computer 802 includes a processor 805. Although illustrated as a single processor 805 in FIG. 8, two or more processors 805 can be used according to particular needs, desires, or particular implementations of the computer 802 and the described functionality. Generally, the processor 805 can execute instructions and can manipulate data to perform the operations of the computer 802, including operations using algorithms, methods, functions, processes, flows, and procedures as described in the present disclosure.

The computer 802 also includes a database 806 that can hold data for the computer 802 and other components connected to the network 830 (whether illustrated or not). For example, database 806 can be an in-memory, conventional, or a database storing data consistent with the present disclosure. In some implementations, database 806 can be a combination of two or more different database types (for example, hybrid in-memory and conventional databases)

according to particular needs, desires, or particular implementations of the computer 802 and the described functionality. Although illustrated as a single database 806 in FIG. 8, two or more databases (of the same, different, or combination of types) can be used according to particular needs, desires, or particular implementations of the computer 802 and the described functionality. While database 806 is illustrated as an internal component of the computer 802, in alternative implementations, database 806 can be external to the computer 802.

The computer 802 also includes a memory 807 that can hold data for the computer 802 or a combination of components connected to the network 830 (whether illustrated or not). Memory 807 can store any data consistent with the present disclosure. In some implementations, memory 807 can be a combination of two or more different types of memory (for example, a combination of semiconductor and magnetic storage) according to particular needs, desires, or particular implementations of the computer 802 and the described functionality. Although illustrated as a single memory 807 in FIG. 8, two or more memories 807 (of the same, different, or combination of types) can be used according to particular needs, desires, or particular implementations of the computer 802 and the described functionality. While memory 807 is illustrated as an internal component of the computer 802, in alternative implementations, memory 807 can be external to the computer 802.

The application 808 can be an algorithmic software engine providing functionality according to particular needs, desires, or particular implementations of the computer 802 and the described functionality. For example, application 808 can serve as one or more components, modules, or applications. Further, although illustrated as a single application 808, the application 808 can be implemented as multiple applications 808 on the computer 802. In addition, although illustrated as internal to the computer 802, in alternative implementations, the application 808 can be external to the computer 802.

The computer 802 can also include a power supply 814. The power supply 814 can include a rechargeable or non-rechargeable battery that can be configured to be either user- or non-user-replaceable. In some implementations, the power supply 814 can include power-conversion and management circuits, including recharging, standby, and power management functionalities. In some implementations, the power-supply 814 can include a power plug to allow the computer 802 to be plugged into a wall socket or a power source to, for example, power the computer 802 or recharge a rechargeable battery.

There can be any number of computers 802 associated with, or external to, a computer system containing computer 802, with each computer 802 communicating over network 830. Further, the terms "client," "user," and other appropriate terminology can be used interchangeably, as appropriate, without departing from the scope of the present disclosure. Moreover, the present disclosure contemplates that many users can use one computer 802 and one user can use multiple computers 802.

Described implementations of the subject matter can include one or more features, alone or in combination.

For example, in a first implementation, a computer-implemented method includes the following. Drilling acoustic signals that are generated during drilling of a well are received. The drilling acoustic signals correspond to a time domain. A fast Fourier transformation (FFT) is performed using the drilling acoustic signals to generate FFT data. Normalized FFT data is generated by normalizing the FFT data using normalization parameters and a drill string rotation rate record of a drill string used during drilling of the well. The drill string rotation rate of the drill string is received during drilling of the well. The normalized apparent power is determined from data points of a predetermined top percentage of the normalized FFT data within a lithological significant frequency range. The normalized apparent power is a measure of the power of the drilling acoustic signals and it is a function of the amplitude and frequency of the normalized FFT data. The lithological significant frequency range is a frequency range within which the drill sounds are more closely related with lithology.

The foregoing and other described implementations can each, optionally, include one or more of the following features:

A first feature, combinable with any of the following features, where the drilling acoustic signals include recorded drill sounds.

A second feature, combinable with any of the previous or following features, the method further including generating, from the FFT data, a color-coded plot plotting signal amplitude versus depth and including an adjacent plot plotting drill string rotation in relation to the depth.

A third feature, combinable with any of the previous or following features, where generating normalized FFT data includes minimizing effects of drill string rotation rates by reducing amplitudes of drilling acoustic signals by an amplitude adjustment.

A fourth feature, combinable with any of the previous or following features, where the predetermined top percentage of the normalized FFT data are data points with relative high amplitude and contains less background noises.

A fifth feature, combinable with any of the previous or following features, where the amplitude adjustment is a function of drill string rotation rate.

A sixth feature, combinable with any of the previous or following features, the method further including updating, using selections from a user and based on a display of the normalized apparent power against the drill string rotation rate, of parameters used in determining the normalized apparent power.

In a second implementation, a non-transitory, computer-readable medium stores one or more instructions executable by a computer system to perform operations including the following. Drilling acoustic signals that are generated during drilling of a well are received. The drilling acoustic signals correspond to a time domain. A fast Fourier transformation (FFT) is performed using the drilling acoustic signals to generate FFT data. Normalized FFT data is generated by normalizing the FFT data using normalization parameters and a drill string rotation rate record of a drill string used during drilling of the well. The drill string rotation rate of the drill string is received during drilling of the well. The normalized apparent power is determined from data points of a predetermined top percentage of the normalized FFT data within a lithological significant frequency range. The normalized apparent power is a measure of the power of the drilling acoustic signals and it is a function of the amplitude and frequency of the normalized FFT data. The lithological significant frequency range is a frequency range within which the drill sounds are more closely related with lithology.

The foregoing and other described implementations can each, optionally, include one or more of the following features:

A first feature, combinable with any of the following features, where the drilling acoustic signals include recorded drill sounds.

A second feature, combinable with any of the previous or following features, the operations further including generating, from the FFT data, a color-coded plot plotting signal amplitude versus depth and including an adjacent plot plotting drill string rotation in relation to the depth.

A third feature, combinable with any of the previous or following features, where generating normalized FFT data includes minimizing effects of drill string rotation rates by reducing amplitudes of drilling acoustic signals by an amplitude adjustment.

A fourth feature, combinable with any of the previous or following features, where the predetermined top percentage of the normalized FFT data are data points with relative high amplitude and contains less background noises.

A fifth feature, combinable with any of the previous or following features, where the amplitude adjustment is a function of drill string rotation rate.

A sixth feature, combinable with any of the previous or following features, the operations further including updating, using selections from a user and based on a display of the normalized apparent power against the drill string rotation rate, of parameters used in determining the normalized apparent power.

In a third implementation, a computer-implemented system includes one or more processors and a non-transitory computer-readable storage medium coupled to the one or more processors and storing programming instructions for execution by the one or more processors. The programming instructions instruct the one or more processors to perform operations including the following. Drilling acoustic signals that are generated during drilling of a well are received. The drilling acoustic signals correspond to a time domain. A fast Fourier transformation (FFT) is performed using the drilling acoustic signals to generate FFT data. Normalized FFT data is generated by normalizing the FFT data using normalization parameters and a drill string rotation rate record of a drill string used during drilling of the well. The drill string rotation rate of the drill string is received during drilling of the well. The normalized apparent power is determined from data points of a predetermined top percentage of the normalized FFT data within a lithological significant frequency range. The normalized apparent power is a measure of the power of the drilling acoustic signals and it is a function of the amplitude and frequency of the normalized FFT data. The lithological significant frequency range is a frequency range within which the drill sounds are more closely related with lithology.

The foregoing and other described implementations can each, optionally, include one or more of the following features:

A first feature, combinable with any of the following features, where the drilling acoustic signals include recorded drill sounds.

A second feature, combinable with any of the previous or following features, the operations further including generating, from the FFT data, a color-coded plot plotting signal amplitude versus depth and including an adjacent plot plotting drill string rotation in relation to the depth.

A third feature, combinable with any of the previous or following features, where generating normalized FFT data includes minimizing effects of drill string rotation rates by reducing amplitudes of drilling acoustic signals by an amplitude adjustment.

A fourth feature, combinable with any of the previous or following features, where the predetermined top percentage of the normalized FFT data are data points with relative high amplitude and contains less background noises.

A fifth feature, combinable with any of the previous or following features, where the amplitude adjustment is a function of drill string rotation rate.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. For example, the signal can be a machine-generated electrical, optical, or electromagnetic signal that is generated to encode information for transmission to a suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field-programmable gate array (FPGA), or an application-specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, such as LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub-programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory.

Graphics processing units (GPUs) can also be used in combination with CPUs. The GPUs can provide specialized processing that occurs in parallel to processing performed by CPUs. The specialized processing can include artificial intelligence (AI) applications and processing, for example. GPUs can be used in GPU clusters or in multi-GPU computing.

A computer can include, or be operatively coupled to, one or more mass storage devices for storing data. In some implementations, a computer can receive data from, and transfer data to, the mass storage devices including, for example, magnetic, magneto-optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer-readable media (transitory or non-transitory, as appropriate) suitable for storing computer program instructions and data can include all forms of permanent/non-permanent and volatile/non-volatile memory, media, and memory devices. Computer-readable media can include, for example, semiconductor memory devices such as random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer-readable media can also include, for example, magnetic devices such as tape, cartridges, cassettes, and internal/removable disks. Computer-readable media can also include magneto-optical disks and optical memory devices and technologies including, for example, digital video disc (DVD), CD-ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated into, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that the user uses. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch-screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

What is claimed is:

1. A computer-implemented method, comprising:
   measuring, in real time, rock properties at a drill bit during drilling of a well;
   receiving, in response to the measuring, drilling acoustic signals generated during the drilling of the well, wherein the drilling acoustic signals correspond to a time domain;
   performing, using the drilling acoustic signals, a fast Fourier transformation (FFT) to generate FFT data;
   generating normalized FFT data by normalizing the FFT data using normalization parameters corresponding to a drill string rotation rate record of a drill string used during drilling of the well, wherein the drill string rotation rate record of the drill string is received during drilling of the well;
   determining normalized apparent power from data points of a predetermined top percentage of the normalized FFT data within a lithological significant frequency range, wherein the normalized apparent power measures a power of the drilling acoustic signals and is a function of an amplitude and frequency of the normalized FFT data, and wherein the lithological significant frequency range is a frequency range within which drill sounds are related with lithology of rock formations in the well;
   providing a display of the normalized apparent power against the drill string rotation rate record, wherein the display includes one or both of the normalization parameters used in determining the normalized apparent power and drilling parameters used during the drilling of the well;
   receiving user selections from the display of one or both of the normalization parameters and the drilling parameters;
   updating, based at least on the user selections, one or more of the normalization parameters used in determining the normalized apparent power and the drilling parameters used during the drilling of the well;
   measuring, in real time, the rock properties at the drill bit; and
   applying, in real time using at least the rock properties and the lithology of the rock formations in the well, the updated drilling parameters to drilling operations, including performing, based on lithology boundaries, geo-steering of the drill bit during the drilling operations.

2. The computer-implemented method of claim 1, wherein the drilling acoustic signals include recorded drill sounds.

3. The computer-implemented method of claim 1, further comprising generating, from the FFT data, a color-coded plot plotting signal amplitude versus depth and including an adjacent plot plotting drill string rotation in relation to the depth.

4. The computer-implemented method of claim 1, wherein generating the normalized FFT data includes minimizing effects of drill string rotation rates by reducing amplitudes of the drilling acoustic signals by an amplitude adjustment.

5. The computer-implemented method of claim 1, wherein the predetermined top percentage of the normalized FFT data are data points with relative high amplitude and containing less background noises.

6. The computer-implemented method of claim 4, wherein the amplitude adjustment is a function of a drill string rotation rate.

7. A non-transitory, computer-readable medium storing one or more instructions executable by a computer system to perform operations comprising:
- measuring, in real time, rock properties at a drill bit during drilling of a well;
- receiving, in response to the measuring, drilling acoustic signals generated during the drilling of the well, wherein the drilling acoustic signals correspond to a time domain;
- performing, using the drilling acoustic signals, a fast Fourier transformation (FFT) to generate FFT data;
- generating normalized FFT data by normalizing the FFT data using normalization parameters corresponding to a drill string rotation rate record of a drill string used during drilling of the well, wherein the drill string rotation rate record of the drill string is received during drilling of the well;
- determining normalized apparent power from data points of a predetermined top percentage of the normalized FFT data within a lithological significant frequency range, wherein the normalized apparent power measures a power of the drilling acoustic signals and is a function of an amplitude and frequency of the normalized FFT data, and wherein the lithological significant frequency range is a frequency range within which drill sounds are related with lithology of rock formations in the well;
- providing a display of the normalized apparent power against the drill string rotation rate record, wherein the display includes one or both of the normalization parameters used in determining the normalized apparent power and drilling parameters used during the drilling of the well;
- receiving user selections from the display of one or both of the normalization parameters and the drilling parameters;
- updating, based at least on the user selections, one or more of the normalization parameters used in determining the normalized apparent power and the drilling parameters used during the drilling of the well;
- measuring, in real time, the rock properties at the drill bit; and
- applying, in real time using at least the rock properties and the lithology of the rock formations in the well, the updated drilling parameters to drilling operations, including performing, based on lithology boundaries, geo-steering of the drill bit during the drilling operations.

8. The non-transitory, computer-readable medium of claim 7, wherein the drilling acoustic signals include recorded drill sounds.

9. The non-transitory, computer-readable medium of claim 7, the operations further comprising generating, from the FFT data, a color-coded plot plotting signal amplitude versus depth and including an adjacent plot plotting drill string rotation in relation to the depth.

10. The non-transitory, computer-readable medium of claim 7, wherein generating the normalized FFT data includes minimizing effects of drill string rotation rates by reducing amplitudes of the drilling acoustic signals by an amplitude adjustment.

11. The non-transitory, computer-readable medium of claim 7, wherein the predetermined top percentage of the normalized FFT data are data points with relative high amplitude and containing less background noises.

12. The non-transitory, computer-readable medium of claim 10, wherein the amplitude adjustment is a function of a drill string rotation rate.

13. A computer-implemented system, comprising:
- one or more processors; and
- a non-transitory computer-readable storage medium coupled to the one or more processors and storing programming instructions for execution by the one or more processors, the programming instructions instructing the one or more processors to perform operations comprising:
  - measuring, in real time, rock properties at a drill bit during drilling of a well;
  - receiving, in response to the measuring, drilling acoustic signals generated during the drilling of the well, wherein the drilling acoustic signals correspond to a time domain;
  - performing, using the drilling acoustic signals, a fast Fourier transformation (FFT) to generate FFT data;
  - generating normalized FFT data by normalizing the FFT data using normalization parameters corresponding to a drill string rotation rate record of a drill string used during drilling of the well, wherein the drill string rotation rate record of the drill string is received during drilling of the well;
  - determining normalized apparent power from data points of a predetermined top percentage of the normalized FFT data within a lithological significant frequency range, wherein the normalized apparent power measures a power of the drilling acoustic signals and is a function of an amplitude and frequency of the normalized FFT data, and wherein the lithological significant frequency range is a frequency range within which drill sounds are related with lithology of rock formations in the well;
  - providing a display of the normalized apparent power against the drill string rotation rate record, wherein the display includes one or both of the normalization parameters used in determining the normalized apparent power and drilling parameters used during the drilling of the well;
  - receiving user selections from the display of one or both of the normalization parameters and the drilling parameters;
  - updating, based at least on the user selections, one or more of the normalization parameters used in determining the normalized apparent power and the drilling parameters used during the drilling of the well;
  - measuring, in real time, the rock properties at the drill bit; and
  - applying, in real time using at least the rock properties and the lithology of the rock formations in the well, the updated drilling parameters to drilling operations, including performing, based on lithology boundaries, geo-steering of the drill bit during the drilling operations.

14. The computer-implemented system of claim 13, wherein the drilling acoustic signals include recorded drill sounds.

15. The computer-implemented system of claim 13, the operations further comprising generating, from the FFT data, a color-coded plot plotting signal amplitude versus depth and including an adjacent plot plotting drill string rotation in relation to the depth.

16. The computer-implemented system of claim 13, wherein generating the normalized FFT data includes minimizing effects of drill string rotation rates by reducing amplitudes of the drilling acoustic signals by an amplitude adjustment.

17. The computer-implemented system of claim 13, wherein the predetermined top percentage of the normalized FFT data are data points with relative high amplitude and containing less background noises.

18. The computer-implemented system of claim 16, wherein the amplitude adjustment is a function of a drill string rotation rate.

* * * * *